(12) United States Patent
Kawahito

(10) Patent No.: US 7,893,859 B2
(45) Date of Patent: Feb. 22, 2011

(54) CONVERTER CIRCUIT, ANALOG/DIGITAL CONVERTER, AND METHOD FOR GENERATING DIGITAL SIGNALS CORRESPONDING TO ANALOG SIGNALS

(75) Inventor: Shoji Kawahito, Hamamatsu (JP)

(73) Assignee: National University Corporation Shizuoka University (JP)

( * ) Notice: Subject to any disclaimer, the term of this patent is extended or adjusted under 35 U.S.C. 154(b) by 0 days.

(21) Appl. No.: 12/303,852

(22) PCT Filed: Jun. 8, 2007

(86) PCT No.: PCT/JP2007/061633
§ 371 (c)(1),
(2), (4) Date: Apr. 2, 2010

(87) PCT Pub. No.: WO2007/142327
PCT Pub. Date: Dec. 13, 2007

(65) Prior Publication Data
US 2010/0182176 A1    Jul. 22, 2010

(30) Foreign Application Priority Data
Jun. 8, 2006    (JP)    .......................... P2006-160152

(51) Int. Cl.
*H03M 1/38*    (2006.01)
(52) U.S. Cl. ..................... 341/161; 341/158
(58) Field of Classification Search ......... 341/122–172; 348/255
See application file for complete search history.

(56) References Cited

U.S. PATENT DOCUMENTS

| 5,499,027 A | 3/1996 | Karanicolas et al. |
| 5,510,789 A | 4/1996 | Lee |
| 5,594,445 A | 1/1997 | Ginetti |

(Continued)

FOREIGN PATENT DOCUMENTS

EP    1 638 208    3/2006

(Continued)

OTHER PUBLICATIONS

European Search Report issued Apr. 13, 2010 in connection with corresponding European Application No. 07 74 4949 with English language translation.

(Continued)

*Primary Examiner*—Lam T Mai
(74) *Attorney, Agent, or Firm*—Ostrolenk Faber LLP

(57) ABSTRACT

A charge corresponding to an analog signal $V_i$ is accumulated in first and second capacitors 25, 27, respectively. A digital signal $V_{DIGN}$ having a digital value ($D_1$, $D_0$, for example) corresponding to the analog signal $V_i$ is generated. By connecting the second capacitor 27 between an output 21c and an inversion input 21a of an operational amplifier circuit 21 and supplying a first capacitor end 25a with an analog signal $V_{D/A}$ corresponding to the digital signal $V_{DIGN}$, a first conversion value $V_{OUT1}$ is generated in the output 21c of the operational amplifier circuit 21. By connecting the first and third capacitors 25, 33 between the output 21c and inversion input 21a of the operational amplifier circuit 21 and supplying a second capacitor end 27a with the analog signal $V_{D/A}$, a second conversion value $V_{OUT2}$ is generated in the output 21c of the operational amplifier circuit 21.

18 Claims, 8 Drawing Sheets

U.S. PATENT DOCUMENTS

| | | | |
|---|---|---|---|
| 5,764,176 A | | 6/1998 | Ginetti |
| 6,166,675 A | * | 12/2000 | Bright .......................... 341/162 |
| 6,362,755 B1 | * | 3/2002 | Tinker .......................... 341/155 |
| 6,518,907 B2 | * | 2/2003 | Tsai ............................ 341/161 |
| 7,015,842 B1 | | 3/2006 | Gupta et al. |
| 2005/0040982 A1 | | 2/2005 | Daito |

FOREIGN PATENT DOCUMENTS

| | | |
|---|---|---|
| JP | 8-505273 | 6/1996 |
| JP | 2004-343163 | 12/2004 |
| JP | 2005-72844 | 3/2005 |

OTHER PUBLICATIONS

English translation of the International Preliminary Report on Patentability issued Jan. 22, 2009, in corresponding PCT application.

Song, et al., "A 12-bit 1-Msample/s Capacitor Error-Averaging Pipelined A/D Converter," IEEE Journal of Solid State Circuits, vol. 23, pp. 1324-1333 (Dec. 1988).

Chiu, Y., "Inherently Linear Capacitor Error-Averaging Techniques for Pipelined A/D Conversion," IEEE Transactions on Circuits and Systems II: Analog and Digital Signal Processing, vol. 47(3), pp. 229-232 (Mar. 2000).

Chen, et al. "A 14b 20MSamples/s CMOS Pipelined ADC," IEEE International Solid-State Circuits Conference, pp. 46-47 (2000).

International Search Report.

Cho, et al., "A Low Power Pipelined Analog-to-Digital Converter using Series Sampling Capacitors," IEEE International Symposium on Circuits and Systems, vol. 6, pp. 6178-6181 (2005).

* cited by examiner

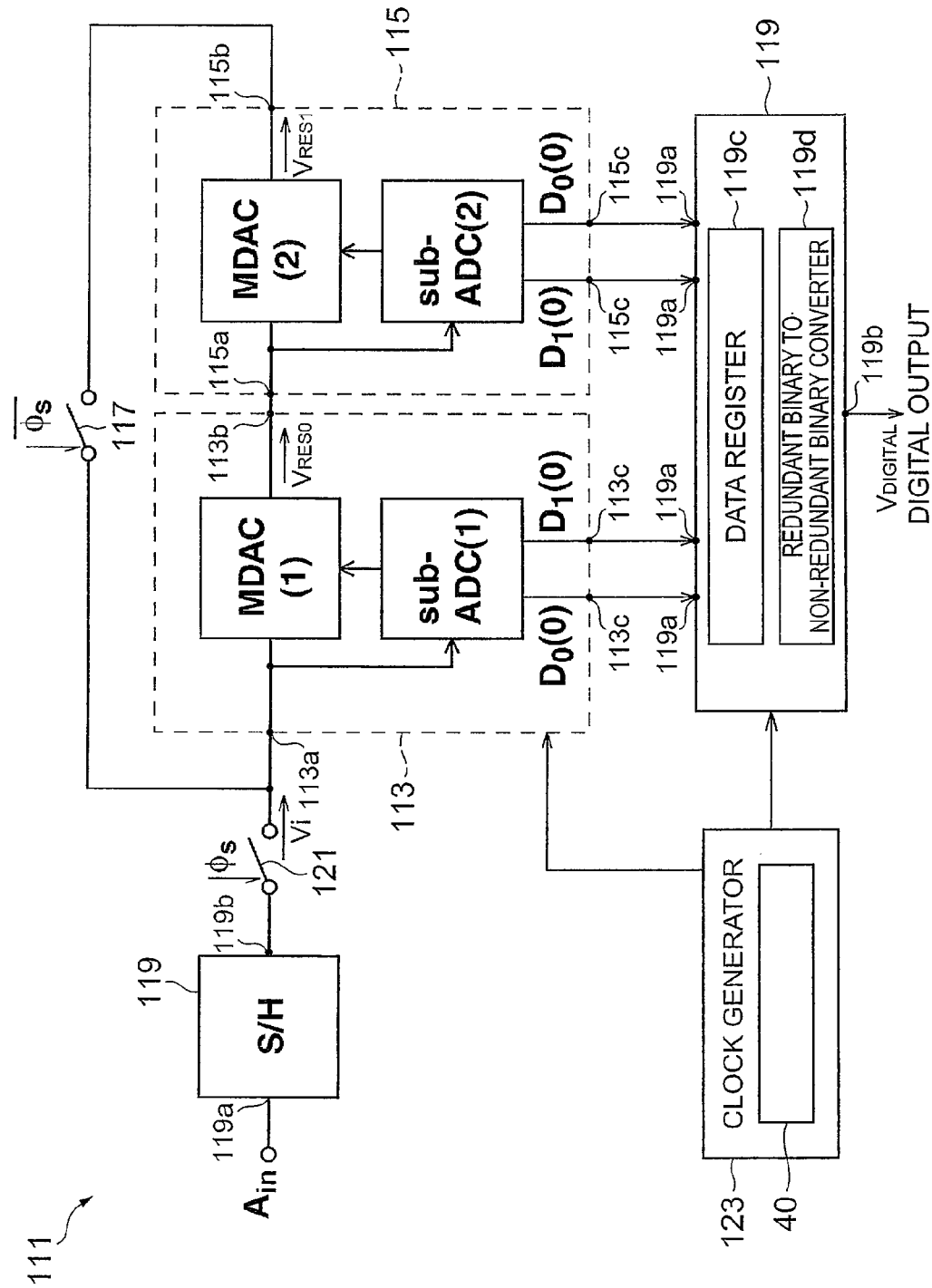

ical field

The present invention relates to a conversion circuit for an analog/digital converter, an analog/digital converter including the conversion circuit, and a method of generating a digital signal corresponding to an analog signal.

BACKGROUND ART

Non-Patent Documents 1 and 2 describe pipelined analog/digital converters (ADC) in which a multiplication type D/A converter (MDAC) including a switched capacitor circuit is used at each stage of the analog/digital converter. Further, these analog/digital converters include capacitors, and mismatches inevitably occur among the capacitors. Non-Patent Documents 1 and 2 describe techniques for canceling these mismatches.

Non-Patent Document 3 describes a technique for correcting mismatches among capacitors used at each stage of an analog/digital converter after an input analog signal has been converted into a digital value.

Patent Document 1 describes a multistage analog/digital converter (ADC) in which capacitor mismatch is corrected digitally. Patent Document 2 describes a pipelined A/D conversion circuit capable of correcting gain errors at each stage and suppressing deterioration of a linearity characteristic. Patent Document 3 describes an A/D converter exhibiting high precision and low area penalty. The A/D converter includes a pipeline stage, and an error correction circuit for performing error correction processing on bit data provided by each stage and generating an n-bit digital signal.

[Non-Patent Document 1] Bang Sup Song, Michael F. Tompsett, and Kadaba R. Lakshmikumar, "A 12 bit 1 M sample/s capacitor error averaging pipelined A/D converter," IEEE Journal of Solid State Circuits, vol. 23, pp. 1324-1333, Dec. 1988.

[Non-Patent Document 2] You Chiu, "Inherently linear capacitor error-averaging techniques for pipelined A/D converters," IEEE Trans. Circuits and Systems II, vol. 47, no. 3, pp. 229-232, 2000.

[Non-Patent Document 3] H. S. Chen, K. Bacrania, B. S. Song, "A 14b 20M Sample/s CMOS pipelined ADC," Deg. Tech. Papers, IEEE Int. Solid-State Circuits Conf., pp. 46-47, 2000.

[Patent Document 1] U.S. Pat. No. 5,510,789

[Patent Document 2] Japanese Unexamined Patent Application Publication 2004-343163

[Patent Document 3] Japanese Unexamined Patent Application Publication 2005-72844

DISCLOSURE OF THE INVENTION

Problems to be Solved by the Invention

In the method described in Non-Patent Document 1, a unit MDAC requires three clocks for a single-cycle operation. In the method described in Non-Patent Document 2, a unit MDAC requires two clocks for a single-cycle operation. In the method described in Non-Patent Document 3, a unit MDAC is capable of performing a single-cycle operation with 1.5 clocks, but an additional amplifier is required to correct capacitor mismatch. In the method described in Patent Document 1, errors in the digital correction must be measured, and a digital circuit is required for the correction.

The present invention has been designed in consideration of these circumstances, and it is an object thereof to provide a conversion circuit for an analog/digital converter, which is capable of compensating for capacitor mismatch through a minimum 1.5 clock operation, an analog/digital converter including this conversion circuit, and a method of generating a digital signal corresponding to an analog signal by compensating for capacitor mismatch through a minimum 1.5 clock operation.

Means for Solving the Problems

One aspect of the present invention is a conversion circuit for an analog/digital converter. This conversion circuit comprises a gain stage having a first input for receiving an input analog signal in a first period and for receiving a converted analog signal, which corresponds to the input analog signal, in a second period which is different to the first period, a second input for receiving the input analog signal in the first period and for receiving the converted analog signal in a third period which is different to the first period and the second period, first to third capacitors, and an operational amplifier circuit. In the first period, the first and second capacitors are connected between the first and second inputs and an inversion input of the operational amplifier circuit, respectively, a charge corresponding to the analog signal is stored in the first second capacitor via the first input, and a charge corresponding to the analog signal is stored in the second capacitor via the second input. In the second period, the second capacitor is connected between an output and the inversion input of the operational amplifier circuit, the operational amplifier circuit generates a first operation value in the output thereof in response to the converted analog signal applied to the first capacitor via the first input, and the first operation value is stored in the third capacitor. In the third period, the second capacitor is connected between the second input and the output of the operational amplifier circuit, the first capacitor is connected between the output and the inversion input of the operational amplifier circuit, the first and third capacitors are connected between the output and the inversion input of the operational amplifier circuit, and the operational amplifier circuit generates a second operation value in the output thereof in response to the converted analog signal applied to the second capacitor via the second input.

According to the above conversion circuit, the first operation value is stored in the third capacitor in the second period, and thus the charge stored in the third capacitor is used in generation of the second conversion value. Therefore, the conversion circuit can compensate for mismatches among the first to third capacitors. Hence, the cancellation of mismatches among the first to third capacitors together with the conversion of an analog signal can be performed using three periods.

Further, the conversion circuit according to the present invention comprises (a) a gain stage having a first input for receiving the input analog signal in the first period and for receiving the converted analog signal in one of the second period and the third period, which are different to the first period, and a second input for receiving the input analog signal in the first period and for receiving the converted analog signal in one of the second period and the third period. The gain stage includes: (a1) an operational amplifier circuit; (a2) a first capacitor having a first end connected to the first input and a second end connected to the inversion input of the operational amplifier circuit; (a3) a second capacitor having a first end connected to the second input and a second end connected to the inversion input of the operational amplifier circuit; (a4) a first switch connected between the first end of the second capacitor and the output of the operational amplifier circuit, for connecting the second capacitor between the inversion input of the operational amplifier circuit and the output of the operational amplifier circuit in the second period; (a5) a second switch connected between the first end of the first capacitor and the output of the operational amplifier circuit, for connecting the first capacitor between the output and the inversion input of the operational amplifier circuit in the third period; (a6) a third capacitor having a first end connected to the output of the operational amplifier circuit and a second end; (a7) a third switch connected between the second end of the third capacitor and the inversion input, for connecting the third capacitor between the output and the inversion input of the operational amplifier circuit in the third period; and (a8) a fourth switch connected between the second end of the third capacitor and a reference potential line, for providing a reference potential to the second end of the third capacitor in the first period and the second period.

According to the above conversion circuit, by connecting the second capacitor to the second input and connecting the first capacitor to the first input, a charge corresponding to the analog signal can be stored in the first and second capacitors in the first period. By connecting the second capacitor between the inversion input and output of the operational amplifier circuit and connecting the first capacitor between the first input and the inversion input of the operational amplifier circuit, the first conversion value can be generated in the output of the operational amplifier circuit in the second period. Furthermore, in the second period, a charge corresponding to the first conversion value can be stored in the third capacitor. Further, by connecting the first and third capacitors between the inversion input and output of the operational amplifier circuit and connecting the second capacitor between the second input and the output of the operational amplifier circuit, the second conversion value can be generated in the output of the operational amplifier circuit in the third period. The charge stored in the third capacitor is taken into account in the generation of the second conversion value, and therefore the conversion circuit allows the compensation of mismatches among the first to third capacitors. Further, the cancellation of mismatches among the first to third capacitors together with the conversion of analog signals can be performed using three periods.

The conversion circuit according to one aspect of the present invention comprises: (b) an input for receiving the input analog signal; (c) a first sampling switch, connected between the first input and the input, for sampling the input analog signal in the first period; (d) a second sampling switch, connected between the second input and the input, for sampling the input analog signal in the first period; (e) a sub-A/D conversion circuit, connected to the input, for generating a digital signal, which has a predetermined number of bits in accordance with the input analog signal, from the input analog signal; (f) a logic circuit, connected to the sub-A/D conversion circuit, for providing a control signal in accordance with the digital signal in the second period and the third period; and (g) a D/A conversion circuit, connected to the logic circuit, for providing the converted analog signal in the second period and the third period. The converted analog signal is generated in accordance with the control signal.

According to the above conversion circuit, by use of the first and second sampling switches, the input analog signal can be supplied to the first and second capacitors in the first period, and the converted analog signal can be supplied to the first and second inputs of the gain stage in the second and third periods. Further, the sub-A/D conversion circuit generates a digital signal having one or more bits which are associated with the input analog signal.

In the conversion circuit according to one aspect of the present invention, the sub-A/D conversion circuit may include a comparator for comparing the input analog signal with a predetermined reference signal to provide a comparison result signal.

This conversion circuit can create a 1-bit digital value. Further, by using plural comparators in the sub-A/D conversion circuit, conversion circuit can also create a digital signal with multiple bits.

In the conversion circuit according to one aspect of the present invention, the sub-A/D conversion circuit may generate a three-value redundant digital signal by comparing the input analog signal with two predetermined reference signals.

According to the above conversion circuit, the sub-A/D conversion circuit compares the input analog signal with two predetermined reference signals to create a three-value digital signal.

In the conversion circuit according to one aspect of the present invention, the gain stage comprises: (a9) a first complementary input for receiving an input analog complementary signal in the first period and receiving a converted analog complementary signal in the second period and the third period; (a10) a second complementary input for receiving the input analog complementary signal in the first period and for receiving the converted analog complementary signal in the second period and the third period; (a11) a fourth capacitor having a first end connected to the first complementary input and a second end connected to a non-inversion input of the operational amplifier circuit; (a12) a fifth capacitor having a first end connected to the second complementary input and a second end connected to the non-inversion input of the operational amplifier circuit; (a13) a fifth switch, which is connected between the first end of the fifth capacitor and a complementary output of the operational amplifier circuit, for connecting the fifth capacitor between the non-inversion input and the complementary output of the operational amplifier circuit in the second period; (a14) a sixth switch, which is connected between the first end of the fourth capacitor and the complementary output of the operational amplifier circuit, for connecting the fourth capacitor between the complementary output and the non-inversion input of the operational amplifier circuit in the third period; (a15) a sixth capacitor having a first end connected to the complementary output of the operational amplifier circuit and a second end; (a16) a seventh switch, which is connected between the second end of the sixth capacitor and the non-inversion input, for connecting the sixth capacitor between the complementary output and the non-inversion input of the operational amplifier circuit in the third period; and (a17) an eighth switch, which is connected between the second end of the sixth capacitor and the reference potential line, for providing the reference potential to the second end of the sixth capacitor in the first period and the second period.

According to the above conversion circuit, a gain stage having a full differential constitution is provided.

Another aspect of the present invention relates to an analog/digital converter. The analog/digital converter comprises (a) a first AD conversion stage, and the first AD conversion stage has an input for receiving an input analog signal and an analog output for providing a residual analog signal. The analog/digital converter comprises one or more second AD conversion stages, and each of the second AD conversion stages has an input for receiving a residual analog signal from a previous-stage AD conversion stage and an analog output for providing the residual analog signal received from the AD conversion stage. The first and second AD conversion stages are connected in series. The first AD conversion stage includes the conversion circuit as described above, and includes a digital output for providing a digital signal constituted by a predetermined number of bits. Each of the second AD conversion stages includes a digital output for providing the digital signal constituted by the predetermined number of bits.

This analog/digital converter enables the compensation of mismatches of capacitors in the gain stage of the first-stage conversion circuit.

In the analog/digital converter according to the present invention, each second AD conversion stage preferably includes the conversion circuit as described above. This analog/digital converter enables the compensation of mismatches of capacitors in all the gain stage circuits of the first-and subsequent conversion stages.

The analog/digital converter according to the present invention may comprise: (c) a sample/hold circuit, which is connected to the input of the first AD conversion stage, for holding an analog signal; (d) an additional analog/digital conversion circuit, which is connected to an analog output of a final conversion stage of the series-connected first and second AD conversion stages, having a digital output for providing a digital signal; and (e) a digital logic circuit connected to the digital output of the first AD conversion stage, the digital outputs of the second AD conversion stages, and the digital output of the additional analog/digital conversion circuit. The digital logic circuit provides a digital signal, and the digital signal corresponds to an AD-converted version of the input analog signal.

According to the analog/digital converter according to another aspect of the present invention, a pipelined analog/digital converter is provided.

In the analog/digital converter according to the present invention, the analog/digital converter includes the single second AD conversion stage, and the analog/digital converter further comprises a feedback switch connected between the input of the first AD conversion stage and the analog output of the second AD conversion stage.

According to the analog/digital converter of the present invention, a cyclic analog/digital converter is provided using two conversion stages.

The analog/digital converter according to the present invention may further comprise a digital logic circuit connected to the digital output of the first AD conversion stage and the digital outputs of the second AD conversion stages. The digital logic circuit provides a digital signal of multiple bits that corresponds to the digital version of the analog signal.

According to the AD conversion stages of the analog/digital converter according to the present invention, each stage provides a digital signal having one or more bits, and the sequence of these digital signals represents a digital version of the analog input signal.

The analog/digital converter according to the present invention may further comprise: a sample/hold circuit for holding an analog signal; and a switch, which is connected between the input of the first AD conversion stage and an output of the sample/hold circuit, for providing the input analog signal in a sampling period. The feedback switch provides a path from the output of the second AD conversion stage to the input of the first AD conversion stage in a feedback period, and the feedback period is different to the sampling period.

According to the analog/digital converter of the present invention, by using the switch and feedback switch between the input of the first AD conversion stage and the output of the sample/hold circuit, the sampling period and the feedback period can be carried out alternately.

Still another aspect of the present invention is a method of generating a digital signal corresponding to an input analog signal by use of a gain stage. The gain stage includes first to third capacitors and an operational amplifier circuit, first ends of the first and second capacitors is connected to an inversion input of the operational amplifier circuit, and a first end of the third capacitor is connected to an output of the operational amplifier circuit. The method comprises: (a) a first step of providing each of the first capacitor and second capacitor with a charge corresponding to the input analog signal to store the charge therein and generating a digital signal that has a predetermined number of bits and is associated with a digital version of the input analog signal; (b) a second step of connecting the second capacitor between the output and the inversion input of the operational amplifier circuit and supplying the first end of the first capacitor with a analog signal of a D/A-converted version of the digital signal to provide the output of the operational amplifier circuit with a first operation value generated from the input analog signal, rearrange charges in the first and second capacitors, and provide the third capacitor with a charge corresponding to the first operation value for storing this charge therein; and (c) a third step of connecting the first and third capacitors between the output and the inversion input of the operational amplifier circuit and supplying the first end of the second capacitor with the analog signal of the D/A-converted version of the digital signal to provide the output of the operational amplifier circuit with a second operation value generated from the input analog signal, and rearrange charges of the first, second and third capacitors.

According to this method, these three steps provide the second conversion value associated with the analog signal. The second conversion value can be used to compensate for mismatches among the capacitors used in the three steps. This method includes steps for a single input analog signal in not only a single ended circuit but also a full differential circuit, and therefore, the three steps may be applied to a full differential circuit as well as the single ended circuit.

The method according to the present invention may further comprise the steps of: providing a subsequent gain stage with the second operation value in the present gain stage as the analog signal; and performing the first to third steps in the subsequent gain stage.

The method according to the present invention may further comprise the steps of: performing the first to third steps in a previous gain stage; and providing the present gain stage with the second operation value of the previous gain stage as the analog signal.

Effects of the Invention

As described above, one aspect of the present invention can provide a conversion circuit capable of compensating for capacitor mismatch through a minimum 1.5-clock operation. Another aspect of the present invention can provide an analog/digital converter including the above conversion circuit. Still another aspect of the present invention can provide a method of generating a digital signal from an analog signal together with compensation of capacitor mismatches through a minimum 1.5-clock operation.

BRIEF DESCRIPTION OF THE DRAWINGS

The above objects and other objects, advantages, and features of the present invention will become more evident from the following detailed description of preferred embodiments of the present invention, which is provided with reference to the attached drawings.

FIG. 8 is a block diagram showing the constitution of an analog/digital converter according to an embodiment.

Figure 1:
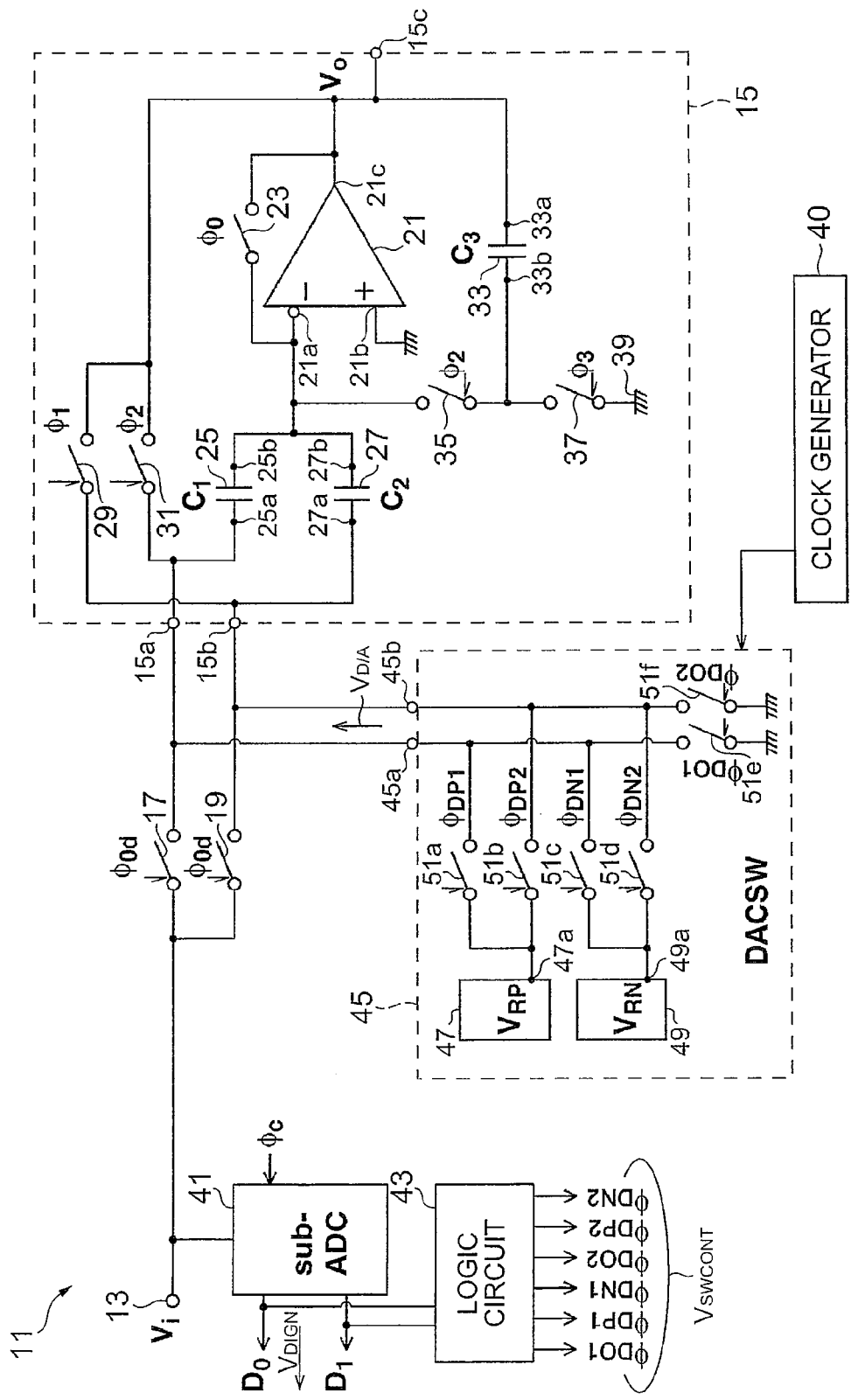
FIG. 1 is a circuit diagram showing a conversion circuit for an analog/digital converter.

EXPLANATION OF REFERENCE NUMERALS 11 conversion circuit
13 input
15 gain stage
17 first sampling switch
19 second sampling switch
$V_i$ input analog signal
15a, 15b gain stage inputs
$V_{D/A}$ converted analog signal
17 first sampling switch
19 second sampling switch
$T_1, T_2, T_3$ periods
21 operational amplifier circuit
23 feedback switch
25 first capacitor
27 second capacitor
29 first switch
31 second switch
33 third capacitor
35 third switch
37 fourth switch
39 reference potential line
41 sub-A/D conversion circuit
43 logic circuit
45 D/A conversion circuit
$V_{DIGN}$ digital signal
$V_{SWCONT}$ control signal
$V_{REF1}, V_{REF2}$ reference signals
$D_0, D_1$ comparison result signals
47 first voltage source
49 second voltage source
51a to 51f first to sixth switches
$\phi_{DO1}, \phi_{DP1}, \phi_{DN1}, \phi_{DO2}, \phi_{DP2}, \phi_{DN2}$ control signals
40 clock generator
$C_1$ capacitance value of first capacitor
$C_2$ capacitance value of second capacitor
$C_3$ capacitance value of third capacitor
12 conversion circuit
55 gain stage
55a, 55b gain stage inputs
53 logic circuit
57 D/A conversion circuit
59a to 59c first to third switches
$\phi_{DO}, \phi_{DP}, \phi_{DN}$ control signals
61 conversion circuit
63 complementary input
65 gain stage
65a, 65b gain stage inputs
65c gain stage output
65d, 65e gain stage complementary inputs
65f gain stage complementary output
$V_{ip}$ input analog signal
$V_{D/A(N)}$ converted analog signal
$V_{D/A(P)}$ converted analog signal
$V_{in}$ input analog complementary signal
73 feedback switch
75 fourth capacitor
77 fifth capacitor
79 fifth switch
81 sixth switch
83 sixth capacitor
85 seventh switch
87 eighth switch
89 D/A conversion circuit
90 sub-A/D conversion circuit
90a, 90b comparators
91 analog/digital converter
93 first AD conversion stage
95 AD conversion stage array
97, 99 second AD conversion stages
101 sample/hold circuit
103 additional analog/digital conversion circuit
105 digital logic circuit
111 analog/digital converter
113 first AD conversion stage
115 second AD conversion stage
117 feedback switch
119 digital logic circuit
121 sample/hold circuit

BEST MODE FOR CARRYING OUT THE INVENTION

The findings of the present invention can be understood easily by considering the following detailed description with reference to the attached drawings provided as examples. Hereafter, embodiments relating to a conversion circuit, a method of generating a digital signal corresponding to an analog signal using a gain stage, a pipelined analog/digital converter, and a cyclic analog/digital converter according to the present invention will be described below with reference to the attached drawings. Where possible, identical reference symbols have been allocated to identical parts.

First Embodiment

Figure 2:
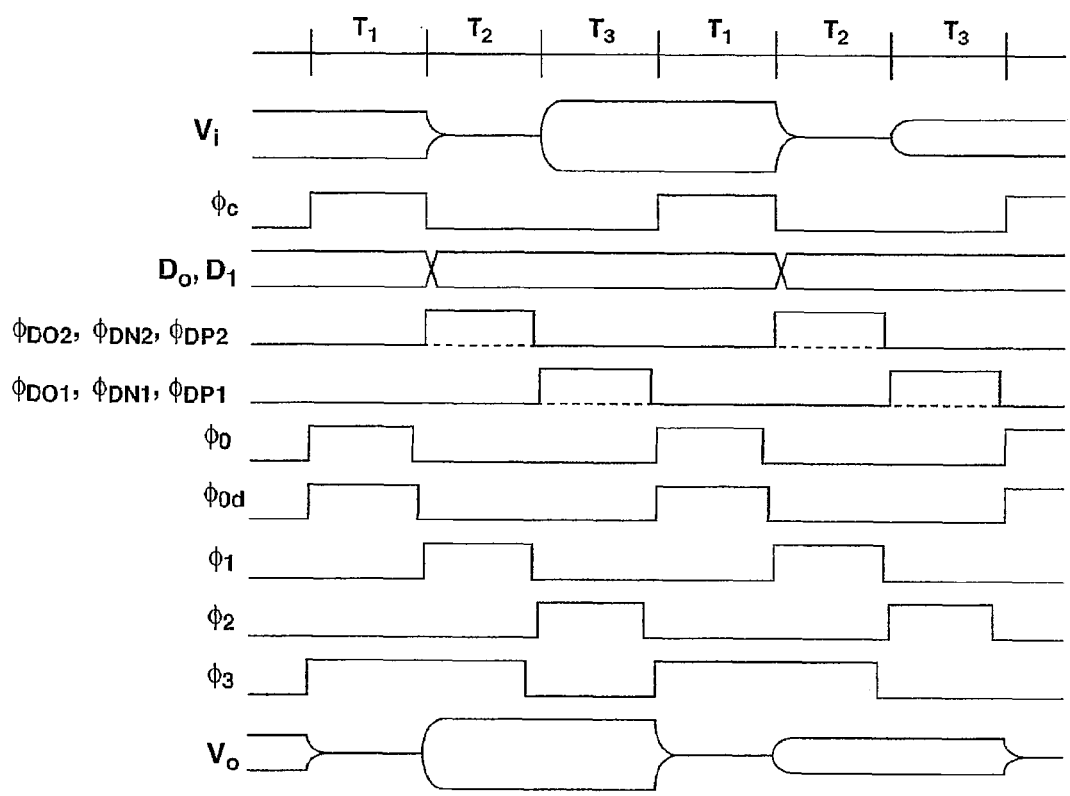
FIG. 2 is a diagram showing a timing chart for the conversion circuit shown in FIG. 1.

FIG. 1 is a circuit diagram showing a conversion circuit for an analog/digital converter. FIG. 2 is a diagram showing a timing chart for the conversion circuit shown in FIG. 1. A conversion circuit 11 includes an input 13, a gain stage 15, a first sampling switch 17, and a second sampling switch 19. The input 13 receives an input analog signal $V_i$.

The gain stage 15 includes a first input 15a and a second input 15b. The first input 15a is provided to receive one analog signal from the input analog signal $V_i$ and a converted analog signal $V_{D/A}$. The second input 15b is provided to receive one analog signal from the input analog signal $V_i$ and the converted analog signal $V_{D/A}$. The first sampling switch 17 is connected between the first input 15a and the input 13, and is provided to perform sampling on the input analog signal $V_i$ during a first period $T_1$. The second sampling switch 19 is connected between the second input 15b and the input 13, and is provided to perform sampling on the input analog signal $V_i$ during the first period $T_1$. The gain stage 15 includes an operational amplifier circuit 21, a feedback switch 23, a first capacitor 25, a second capacitor 27, a first switch 29, a second switch 31, a third capacitor 33, a third switch 35, and a fourth switch 37. The operational amplifier circuit 21 includes an inversion input 21a, a non-inversion input 21b, and an output 21c. The feedback switch 23 is connected between the inversion input 21a of the operational amplifier circuit 21 and the output 21c of the operational amplifier circuit 21, and connects the output 21c of the operational amplifier circuit 21 to the inversion input 21a of the operational amplifier circuit 21 during the first period $T_1$. The first capacitor 25 includes a first end 25a connected to the first input 15a and a second end 25b connected to the inversion input 21a. The second capacitor 27 includes a first end 27a connected to the second input 15b and a second end 27b connected to the inversion input 21a. The first switch 29 is connected between the first end 27a of the second capacitor 27 and the output 21c of the operational amplifier circuit 21, and is provided to connect the second capacitor 27 between the inversion input 21a and the output 21c of the operational amplifier circuit 21 during a second period $T_2$, which is different to the first period $T_1$. The second switch 31 is connected between the first end 25a of the first capacitor 25 and the output 21c of the operational amplifier circuit 21, and is provided to connect the first capacitor 25 between the output 21c and the inversion input 21a of the operational amplifier circuit 21 during a third period $T_3$, which is different to the first period $T_1$ and the second period $T_2$. The third capacitor 33 includes a first end 33a connected to the output 21c of the operational amplifier circuit 21 and a second end 33b. The third switch 35 is connected between the second end 33b of the third capacitor 33 and the inversion input 21a, and is provided to connect the third capacitor 33 between the output 21c and the inversion input 21a of the operational amplifier circuit 21 during the third period $T_3$. The fourth switch 37 is connected between the second end 33b of the third capacitor 33 and a reference potential line 39 serving as an earth wire, and is provided to provide a reference potential to the second end 33b of the third capacitor 33 during the first period $T_1$ and the second period $T_2$. The output 15c of the gain stage 15 is connected to the output 21c of the operational amplifier circuit 21.

According to the conversion circuit 11, a charge corresponding to the input analog signal $V_i$ can be accumulated in the first and second capacitors 25, 27 during the first period $T_1$. In the second period $T_2$, the second capacitor 27 is connected between the inversion input 21a and the output 21c of the operational amplifier circuit 21, and the first capacitor 25 is connected between the first input 15a and the inversion input 21c of the operational amplifier circuit 21, and as a result, a first conversion value can be generated in the output 21c of the operational amplifier circuit 21. Further, a charge corresponding to the first conversion value can be accumulated in the third capacitor 33 during the second period $T_2$. In the third period $T_3$, the first and third capacitors 25, 33 are connected between the inversion input 21a and the output 21c of the operational amplifier circuit 21, and the second capacitor 27 is connected between the second input 15b and the output 21c of the operational amplifier circuit 21, and as a result, a second conversion value can be generated in the output 21c of the operational amplifier circuit 21. During generation of the second conversion value, the charge accumulated in the third capacitor 33 is taken into account, and therefore mismatches among the first to third capacitors 25, 27, 33 are compensated for. Hence, using the three periods $T_1$, $T_2$, $T_3$, compensation for mismatches among the first to third capacitors 25, 27, 33 and conversion of an analog signal into a digital signal can be achieved.

As shown in FIG. 1, the conversion circuit 11 may include a sub-A/D conversion circuit 41, a logic circuit 43, and a D/A conversion circuit 45. The sub-A/D conversion circuit 41 is connected to the input 13 and generates a digital signal $V_{DIGN}$ in accordance with the input analog signal $V_i$. The digital signal $V_{DIGN}$ takes a predetermined number of values, preferably two values ("0", "1") or three values ("−1", "0", "+1"), for example. The logic circuit 43 is connected to the sub-A/D conversion circuit 41, and generates a control signal $V_{SWCONT}$ in accordance with the digital signal $V_{DIGN}$. The D/A conversion circuit 45 is connected to the logic circuit 43, and includes outputs 45a, 45b for providing the converted analog signal $V_{D/A}$. The converted analog signal $V_{D/A}$ is generated in accordance with the control signal $V_{SWCONT}$. The control signal $V_{SWCONT}$ is used to provide the converted analog signal $V_{D/A}$ to the gain stage 15 during the second period $T_2$ and the third period $T_3$.

Figure 3:
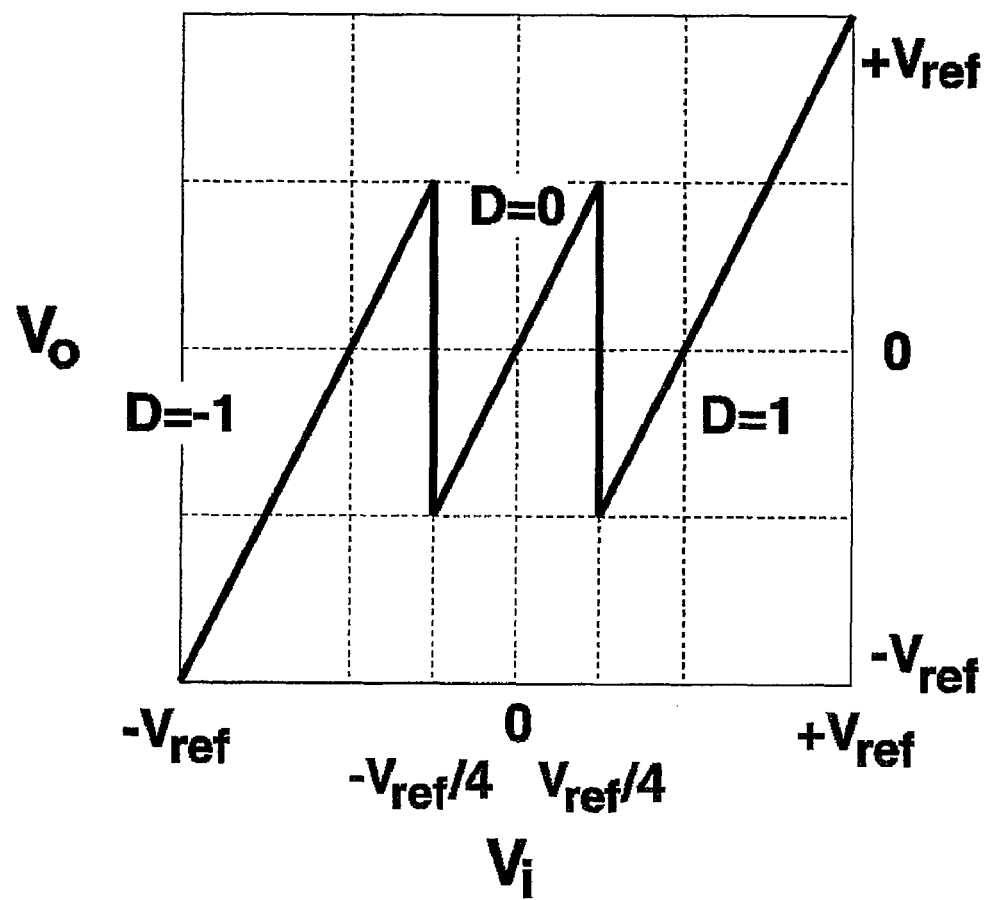
FIG. 3 is a diagram showing a conversion characteristic of a D/A conversion circuit.

The sub-A/D conversion circuit 41 may include a single comparator, for example. The comparator compares the input analog signal with a predetermined reference signal, and provides a signal indicating the comparison result. When this conversion circuit is used, a 1-bit digital value is obtained. By increasing the number of comparators, a digital signal having a bit number exceeding a single bit is obtained. The sub-A/D conversion circuit 41 may include two comparators, for example. The comparators respectively compare the input analog signal with respective predetermined reference signals $V_{REF1}$, $V_{REF2}$, and provide comparison result signals $D_0$, $D_1$, as shown in FIG. 1. As shown in FIG. 3, the reference signal $V_{VREF1}$ may be −Vref/4, for example, and the reference signal $V_{REF2}$ may be +Vref/4, for example.

Range of input analog signal $V_i$ Digital signal $$-Vref/4 > V_i, -1(D_1=0, D_0=0) \tag{1}$$

$$Vref/4 \geq V_i \geq -Vref/4, 0(D_1=0, D_0=1) \tag{2}$$

$$V_i > +Vref/4, +1(D_1=1, D_0=1) \tag{3}$$

When the sub-A/D conversion circuit 41 compares the input analog signal to two predetermined reference signals, a three-value redundant digital signal can be generated. According to the conversion circuit 11, the input analog signal is compared to two predetermined reference signals, and therefore a three-value digital signal is obtained. As shown in FIG. 2, the sub-A/D conversion circuit 41 is preferably activated in the first period $T_1$, for example. Further, the sub-A/D conversion circuit 41 may be activated in the third period $T_3$ instead of, or in addition to, the first period $T_1$.

The D/A conversion circuit 45 further includes a first voltage source 47 and a second voltage source 49. The first voltage source 47 provides a voltage $V_{RP}$. The second voltage source 49 provides a voltage $V_{RN}$. An output 47a of the first voltage source 47 is connected to the first input 15a via a first switch 51a and a first output 45a, and is connected to the second input 15b via a second switch 51b and a second output 45b. An output 49a of the second voltage source 49 is connected to the first input 15a via a third switch 51c and the first output 45a, and is connected to the second input 15b via a fourth switch 51d and the second output 45b. Further, the first output 45a is connected to a first end of a fifth switch 51e, and a second end of the fifth switch 51e is connected to the earth wire. The second output 45b is connected to a first end of a sixth switch 51f, and a second end of the sixth switch 51f is connected to the earth wire. As shown in FIG. 1, the logic circuit 43 generates control signals $\phi_{DO1}$, $\phi_{DP1}$, $\phi_{DN1}$, $\phi_{DO2}$, $\phi_{DP2}$, $\phi_{DN2}$ for controlling the first to sixth switches 51a to 51f, respectively. As shown in FIG. 2, the control signals $\phi_{DO2}$, $\phi_{DP2}$, $\phi_{DN2}$, are provided in the second period $T_2$. The values of the digital signals $D_1$, $D_0$ determine which of the control signals $\phi_{DO2}$, $\phi_{DP2}$, $\phi_{DN2}$ is to be activated. The control signals $\phi_{DO1}$, $\phi_{DP1}$, $\phi_{DN1}$ are provided in the third period $T_3$. The values of the digital signals $D_1$, $D_0$ determine which of the control signals $\phi_{DO1}$, $\phi_{DP1}$, $\phi_{DN1}$ is to be activated.

In response to a control signal from the logic circuit 43, the D/A conversion circuit 45 provides $V_{D/A}$=Vref when a condition (1) (−Vref/4>$V_i$) is satisfied, provides $V_{D/A}$=0 when a condition (2) (Vref/4≧$V_i$≧−Vref/4) is satisfied, and provides $V_{D/A}$=−Vref when a condition (3) ($V_i$>+Vref/4) is satisfied, for example.

Three-value A/D conversion is then performed on these three regions to allocate "−1", "0", "+1" digital codes. The first code serves as the most significant digit. The following calculation is performed in accordance with the characteristic shown in FIG. 3.

$$V_{OUT}=2\times V_{in}-D\times Vref$$

More specifically, in this calculation, A/D conversion is performed successively from the high order digit, the input of the gain stage is doubled, and one of
(1) subtraction of the fixed value Vref
(2) addition of the fixed value Vref, and
(3) application of zero is performed, depending on the A/D conversion value of the gain stage. As a result, the output of the gain stage is invariably held within a range of −Vref to +Vref.

By performing A/D conversion using three values in this manner, redundancy is generated in the digital value. As a result of this redundancy, the precision requirement of the comparator provided in the sub-A/D circuit is greatly eased, while highly precise A/D conversion becomes possible. The respective digits of a binary number take two values, namely "0" and "1". The digital signal of each gain stage takes three values, namely "−1", "0" and "+1", and it may therefore be considered that 1.5-bit A/D conversion is performed at each gain stage.

A clock generator 40 provides a clock signal illustrated in FIGS. 1 and 2.

In a preferred embodiment, a capacitance value C1 of the first capacitor 25 is equal to a capacitance value C2 of the second capacitor 27. However, due to errors caused by various factors, the capacitance value C1 of the first capacitor 25 does not match the capacitance value C2 of the second capacitor 27. In other words, a mismatch exists between the capacitance value C1 of the first capacitor 25 and the capacitance value C2 of the second capacitor 27. To achieve analog/digital conversion having a higher degree of precision, it is necessary to compensate for this mismatch.

Next, an operation of the conversion circuit and mismatch compensation will be described with reference to FIGS. 2 and 4. Mismatch compensation is realized in a process for generating a digital signal corresponding to an analog signal using the gain stage 11.

Figure 4:
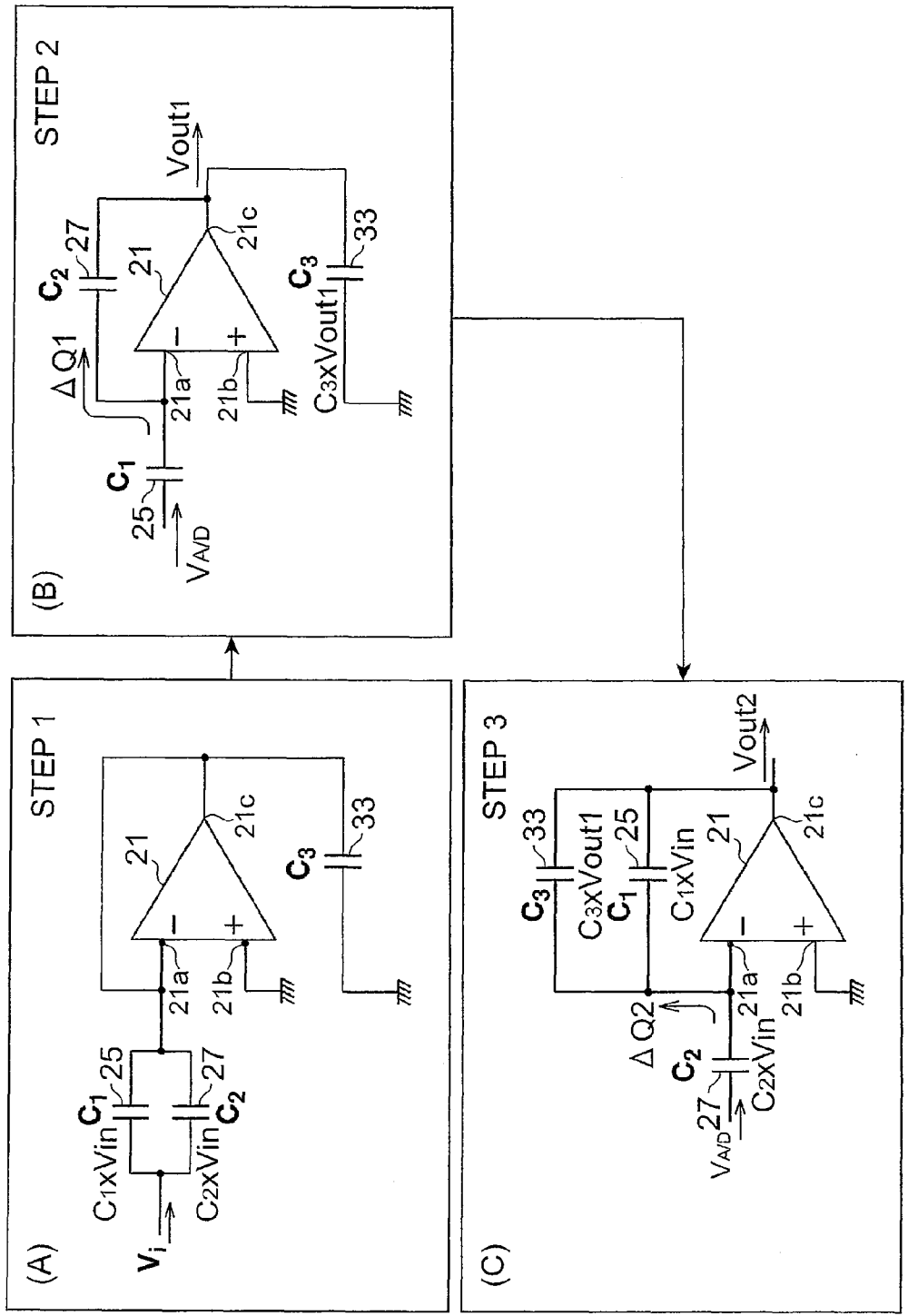
FIG. 4 is a diagram showing three steps for compensating for capacitor mismatch in the conversion circuit.

First, as shown in a portion (A) of FIG. 4, the switches 29, 30 are opened in response to clocks $\phi_1$, $\phi_2$, and the switches 17, 19 are closed in response to a clock $\phi_{0d}$, whereby the first capacitor 25 and second capacitor 27 are connected to the input 13. In response to a clock $\phi_0$, the inversion input 21a of the operational amplifier circuit 21 is connected to the output 21c. The switch 35 is opened in response to a clock $\phi_2$, and the switch 37 is closed in response to a clock $\phi_3$, whereby the third capacitor 33 is connected between the output 21c of the operational amplifier circuit 21 and the earth wire. The sub-A/D conversion circuit 41 generates the digital signal $V_{DIGN}$ corresponding to the analog signal $V_i$. The digital signal $V_{DIGN}$ takes a digital value constituted by a predetermined number of bits (for example, $D_1$, $D_0$). Further, a charge corresponding to the input analog signal $V_i$ is accumulated in each of the first capacitor 25 and the second capacitor 27. A charge $Q_1=C_1\times V_1$ is accumulated in the first capacitor 25, and a charge $Q_2=C_2\times V_1$ is accumulated in the second capacitor 27. The output 21c of the operational amplifier circuit 21 is connected to the inversion input 21a, and both the output 21c and the inversion input 21a take an identical value to the potential of the non-inversion input 21b.

The switches 17, 19 are opened in response to the clock $\phi_{0d}$, whereby the first capacitor 25 and second capacitor 27 are disconnected from the input 13. The first end 27a of the second capacitor 27 is connected to the output 21c of the operational amplifier circuit 21 in response to the clock $\phi_1$. The third capacitor 33 is connected between the output 21c of the operational amplifier circuit 21 and the earth wire in response to the clocks $\phi_2$, $\phi_3$. In response to the clock $\phi_0$, the inversion input 21a of the operational amplifier circuit 21 is disconnected from the output 21c. As shown in a portion (B) of FIG. 4, the second capacitor 27 is connected between the output 21c and the inversion input 21a of the operational amplifier circuit 21, and the converted analog signal $V_{D/A}$ corresponding to the digital signal $V_{DIGN}$ is supplied to the first end 25a of the first capacitor 25. As a result, a first conversion value $V_{OUT1}$ relating to the input analog signal $V_i$ is generated in the output 21c of the operational amplifier circuit 21, and the charges of the first and second capacitors 25, 27 are relocated.

By applying the converted analog signal $V_{D/A}$, a charge $\Delta Q_1=C_1\times V_i-C_1\times D\times Vref$ moves from the first capacitor 25 to the second capacitor 27 (D takes a value of "+1", "0", or "−1" in accordance with the value of the converted analog signal $V_{D/A}$). A sampling charge $C_2\times V_i$ and a moving charge $\Delta Q_1$ are accumulated in the second capacitor 27. The non-inversion input 21b of the operational amplifier circuit 21 is connected to the earth wire, and therefore a charge $V_{OUT1}\times C_2$ is accumulated in the second capacitor 27. The charge $V_{OUT1}\times C_2$ is equal to $C_2\times V_i+C_1\times V_i-C_1\times D\times Vref$ in accordance with the charge conservation law. Hence, $$V_{OUT1}=(C_2\times V_i+C_1\times V_i-C_1\times D\times Vref)/C_2=(1+C_1/C_2)\times V_i-D\times Vref\times C_1/C_2$$

is obtained. Further, a charge $V_{OUT1}\times C_3$ is accumulated in the third capacitor 33.

The switch 29 is opened in response to the clock $\phi_1$, whereby the second capacitor 27 is disconnected from the output 21c of the operational amplifier circuit 21. The switch 31 is closed in response to the clock $\phi_2$, whereby the first end 25a of the first capacitor 25 is connected to the output 21c of the operational amplifier circuit 21. The second end 33b of the third capacitor 33 is connected to the output 21c of the operational amplifier circuit 21 in response to the clocks $\phi_2$, $\phi_3$. As shown in a portion (C) of FIG. 4, the first and third capacitors 25, 33 are connected between the output 21c and the inversion input 21a of the operational amplifier circuit 21, and the converted analog signal $V_{D/A}$ is supplied to the first end 27a of the second capacitor 27. As a result, a second conversion value $V_{OUT2}$ is generated in the output 21c of the operational amplifier circuit 21. The second conversion value $V_{OUT2}$ is related to the input analog signal $V_i$. A charge $(C_1+C_3) \times V_{OUT2}$ is accumulated in the first and third capacitors 25, 33.

Next, the digital signal $V_{DIGN}$ corresponding to the analog signal $V_i$ is output in response to the clock $\phi_0$.

According to the above description, the charge $V_{OUT1} \times C_2$ ($=C_2 \times V_i + C_1 \times V_i - C_1 \times D \times Vref$) is accumulated in the second capacitor 27, and by applying the converted analog signal $V_{D/A}$, a charge $\Delta Q_2 = V_{OUT1} \times C_2 - C_2 \times D \times Vref = C_2 \times V_i + C_1 \times V_i - C_1 \times D \times Vref - C_2 \times D \times Vref$ moves from the second capacitor 27 to the first and third capacitors 25, 33 (D takes a value of "+1", "0", or "−1" in accordance with the value of the converted analog signal $V_{D/A}$). As a result of this movement, the overall charge of the first and third capacitors 25, 33 is represented by the sum of the following three charges:
Moving charge: $C_2 \times V_i + C_1 \times V_i - C_1 \times D \times Vref - C_2 \times D \times Vref$
Charge of third capacitor: $C_3 \times V_{OUT1}$
Charge of second capacitor: $C_1 \times D \times Vref$,
or in other words $C_2 \times V_i + C_1 \times V_i - C_2 \times D \times Vref + C_3 \times V_{OUT1}$.

Meanwhile, the overall charge of the first and third capacitors 25, 33 is
$(C_1+C_3) \times V_{OUT2}$. According to the charge conservation law, the two are equal and therefore
$(C_1+C_3) \times V_{OUT2} = C_2 \times V_i + C_1 \times V_i - C_2 \times D \times Vref + C_3 \times V_{OUT1}$
is established. When
$V_{OUT1} = (1+C_1/C_2) \times V_i - D \times Vref \times C_1/C_2$ is inserted into this equation, $$(C_1+C_3) \times V_{OUT2} = (C_1+C_2+(1+C_1/C_2) \times C_3) \times V_i - (C_2 + C_3 \times C_1/C_2) \times D \times Vref$$

is obtained, whereby the second conversion value is expressed as $$V_{OUT2} = V_i \times (C_1+C_2) \times (1+C_3/C_2)/(C_1+C_3) - D \times Vref \times (C_2+C_3 \times C_1/C_2)/(C_1+C_3).$$

When this equation is rewritten using $\Delta C_3 = C_3 - C_1$, $\Delta C_2 = C_2 - C_1$, $$V_{OUT2} = V_i \times (2+2 \times (\Delta C_2 - \Delta C_3) \times \Delta C_2/(2 \times \Delta C_1 + \Delta C_3)/ (C_1 + \Delta C_3)) - D \times Vref \times (1 + (\Delta C_2 - \Delta C_3) \times \Delta C_2/(2 \times C_1 \Delta C_3)/(C_1 + \Delta C_2))$$

is obtained. The error term is $(\Delta C_2 - \Delta C_3) \times \Delta C_2/(2 \times \Delta C_1 + \Delta C_3)/(C_1 + \Delta C_2)$. For example, assuming that $\Delta C_2/C_1 = 0.01$ and $\Delta C_3/C_1 = 0.01$, the contribution of the error term is approximately 0.0001. In other words, when the conversion circuit according to this embodiment is used, even when variation in the capacitance values is approximately 1%, the contribution of the variation in the capacitance values can be reduced to approximately 0.01%, and as a result, when this conversion circuit is used, an analog/digital converter having 13-bit to 14-bit precision can be realized.

Figure 5:
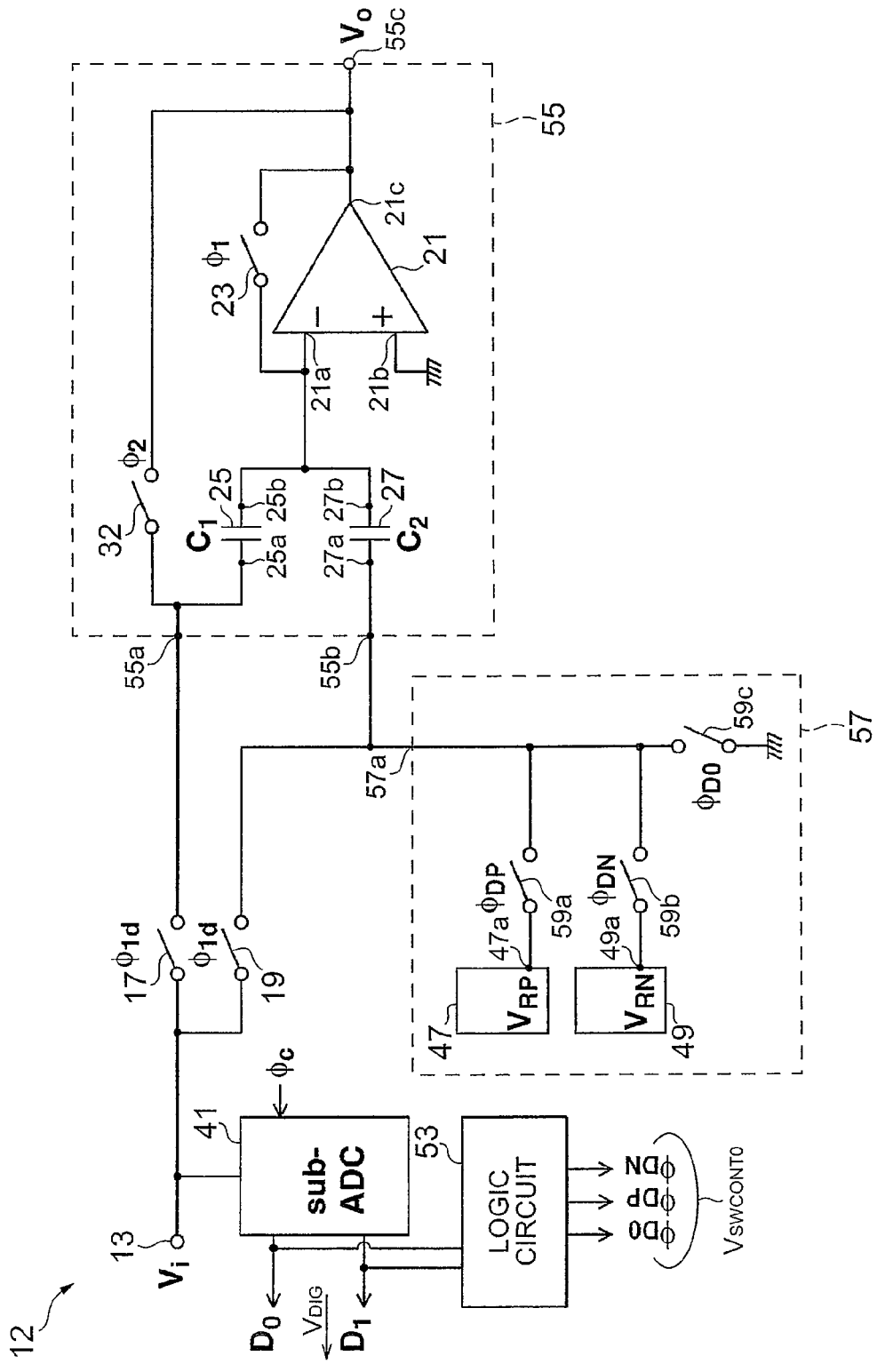
FIG. 5 is a circuit diagram showing a conversion circuit structured not to compensate for mismatches among capacitance values of the capacitors.

FIG. 5 is a circuit diagram showing a conversion circuit structured not to compensate for a mismatch in the capacitance values of the capacitors. This conversion circuit 12 includes the input 13, a gain stage 55, the first sampling switch 17, and the second sampling switch 19. The input 13 receives the input analog signal $V_i$. The gain stage 55 includes a first input 55a and a second input 55b. The first input 55a is provided to receive the input analog signal $V_i$. The second input 55b is provided to receive the input analog signal $V_i$ and the converted analog signal $V_{D/A}$. The first sampling switch 17 is connected between the first input 55a and the input 13, and is provided to perform sampling on the input analog signal $V_i$ during the first period $T_1$. The second sampling switch 19 is connected between the second input 55b and the input 13, and is provided to perform sampling on the input analog signal $V_i$ during the first period $T_1$. The gain stage 55 includes the operational amplifier circuit 21, the feedback switch 23, the first capacitor 25, the second capacitor 27, and a switch 32.

The feedback switch 23 is connected between the inversion input 21a of the operational amplifier circuit 21 and the output 21c of the operational amplifier circuit 21. The first capacitor 25 includes the first end 25a connected to the first input 55a and the second end 25b connected to the inversion input 21a. The second capacitor 27 includes the first end 27a connected to the second input 55b and the second end 27b connected to the inversion input 21a. The switch 32 is connected between the first end 25a of the first capacitor 25 and the output 21c of the operational amplifier circuit 21, and is provided to connect the first capacitor 25 between the output 21c and the inversion input 21a of the operational amplifier circuit 21 during the second period $T_2$, which is different to the first period $T_1$. The output 55c of the gain stage 55 is connected to the output 21c of the operational amplifier circuit 21.

As shown in FIG. 5, the conversion circuit 12 may include the sub-A/D conversion circuit 41, a logic circuit 53, and a D/A conversion circuit 57. The logic circuit 53 is connected to the sub-A/D conversion circuit 41, and generates a control signal $V_{SWCONT0}$ in accordance with a digital signal $V_{DIG}$. The D/A conversion circuit 57 is connected to the logic circuit 43, and includes an output 57a for providing the converted analog signal $V_{D/A}$. The converted analog signal $V_{D/A}$ is generated in accordance with the control signal $V_{SWCONT0}$. The control signal $V_{SWCONT0}$ is used to provide the converted analog signal $V_{D/A}$ to the gain stage 55 during the second period $T_2$. By comparing the input analog signal to two predetermined reference signals, the sub-A/D conversion circuit 41 can generate a redundant digital signal constituted by 1.5 bits. According to this conversion circuit, the input analog signal is compared to two predetermined reference signals, and therefore a digital signal constituted by 1.5 bits is obtained.

Further, the D/A conversion circuit 57 includes the first voltage source 47 and the second voltage source 49. The first voltage source 47 provides the voltage $V_{RP}$. The second voltage source 49 provides the voltage $V_{RN}$. The output 47a of the first voltage source 47 is connected to the second input 55b via a first switch 59a and the output 57a, and the output 49a of the second voltage source 49 is connected to the second input 55b via a second switch 59b and the output 57a. The output 57a is connected to the earth wire via the third switch 51c. As shown in FIG. 5, the logic circuit 53 generates control signals $\phi_{DO}$, $\phi_{DP}$, $\phi_{DN}$ for controlling the first to third switches 59a to 59c, respectively. The values of the digital signals $D_1$, $D_0$ determine which of the control signals $\phi_{DO}$, $\phi_{DP}$, $\phi_{DN}$ is to be activated.

Operations of the conversion circuit 12 can be understood from the description provided with reference to portions (A) and (B) of FIG. 4. Briefly, as shown in the portion (A) of FIG. 4, a charge corresponding to the input analog signal $V_i$ is accumulated in each of the first capacitor 25 and second capacitor 27. The charge $Q_1 = C_1 \times V_1$ is accumulated in the first capacitor 25, and the charge $Q_2 = C_2 \times V_1$ is accumulated in the second capacitor 27. Further, the digital signal $V_{DIG}$ corresponding to the analog signal $V_i$ is generated. The digital signal $V_{DIG}$ takes a digital value constituted by a predetermined number of bits (for example, $D_1$, $D_0$). The output 21c of the operational amplifier circuit 21 is connected to the inversion input 21a, and both the output 21c and the inversion input 21a take an identical value to the potential of the non-inversion input 21b.

As shown in the portion (B) of FIG. 4, the first capacitor 25 is connected between the output 21c and the inversion input 21a of the operational amplifier circuit 21, and the converted analog signal $V_{D/A}$ corresponding to the digital signal $V_{DIG}$ is supplied to the first end 27a of the second capacitor 27. As a result, the first conversion value $V_{OUT1}$ relating to the input analog signal $V_i$ is generated in the output 21c of the operational amplifier circuit 21, and the charges of the first and second capacitors 25, 27 are relocated.

By applying the converted analog signal $V_{D/A}$, a charge $\Delta Q_0 = C_2 \times V_i - C_2 \times D \times Vref$ moves from the second capacitor 27 to the first capacitor 25 (D takes a value of "+1", "0", or "−1" in accordance with the value of the converted analog signal $V_{D/A}$). The sampling charge $C_1 \times V_i$ and a moving charge $\Delta Q_0$ are accumulated in the first capacitor 25. The non-inversion input 21b of the operational amplifier circuit 21 is connected to the earth wire, and therefore a charge $V_{OUT1} \times C_1$ is accumulated in the first capacitor 25. The charge $V_{OUT1} \times C_1$ is equal to $C_1 \times V_i + C_2 \times V_i - C_2 \times D \times Vref$. In other words, $$V_{OUT1} = (1 + C_2/C_1) \times V_i - D \times Vref \times C_2/C_1.$$

When $\Delta C_2 = C_2 - C_1$, this is rewritten as $$V_{OUT1} = (2 + C_2/C_1) \times V_i - D \times Vref \times (1 + \Delta C_2/C_1).$$

When it is assumed that $\Delta C_2/C_1 = 0.01$, the contribution of the error term is 0.01.

As described above, according to this embodiment, a conversion circuit capable of compensating for capacitor mismatch through a minimum 1.5 clock operation is provided.

According to the procedure shown in the portions (A) to (C) of FIG. 4, the second conversion value relating to the analog signal is obtained by performing three steps. In this second conversion value, mismatches among the capacitors used in the three steps are compensated for. Furthermore, according to this embodiment, a method of compensating for mismatches among three capacitors through a minimum 1.5 clock operation and thereby generating a digital signal corresponding to an analog signal is provided.

This procedure illustrates steps performed for a single input analog signal in a full differential circuit, and therefore the three steps may be applied to a full differential circuit in addition to a single end circuit.

Figure 6:
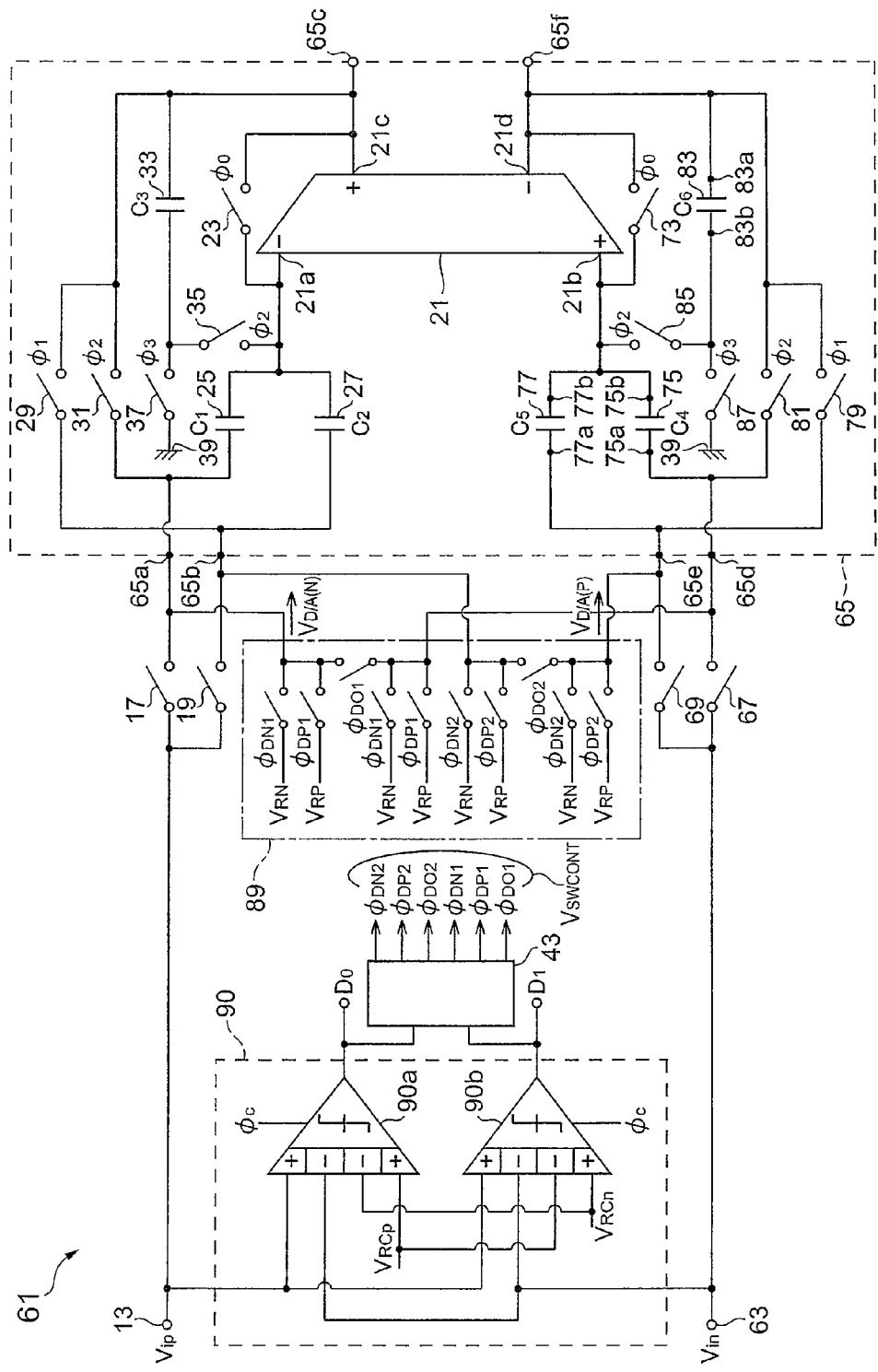
FIG. 6 is a circuit diagram showing a conversion circuit for an analog/digital converter.

FIG. 6 is a circuit diagram showing a conversion circuit for an analog/digital converter. As shown in FIG. 6, this conversion circuit is a full differential circuit. The conversion circuit 61 includes the input 13, the first sampling switch 17, the second sampling switch 19, and in place of the gain stage 15, a gain stage 65. The gain stage 65 includes a first input 65a, a second input 65b, an output 65c, a first complementary input 65d, a second complementary input 65e, and a complementary output 65f. The first input 65a is provided to receive one analog signal from an input analog signal $V_{ip}$ and a converted analog signal $V_{D/A}$ (N). The second input 65b is provided to receive one analog signal from the input analog signal $V_{ip}$ and a converted analog signal $V_{D/A}$ (P). The first complementary input 65d is provided to receive one analog complementary signal from an input analog complementary signal $V_{in}$ and a converted analog complementary signal $V_{D/A}$ (N). The second complementary input 65e is provided to receive one analog complementary signal from the input analog complementary signal $V_{in}$ and a converted analog complementary signal $V_{D/A}$ (P).

The first sampling switch 17 is connected between the first input 65a and the input 13, and is provided to perform sampling on the input analog signal $V_{ip}$ during the first period $T_1$. The second sampling switch 19 is connected between the second input 65b and the input 13, and is provided to perform sampling on the input analog signal $V_{ip}$ during the first period $T_1$.

The conversion circuit 61 may further include a complementary input 63, a third sampling switch 67, and a fourth sampling switch 69. The third sampling switch 67 is connected between the first complementary input 65d of the gain stage 65 and the complementary input 63, and is provided to perform sampling on the input analog complementary signal $V_{in}$ during the first period $T_1$. The fourth sampling switch 69 is connected between the second complementary input 65e and the complementary input 63, and is provided to perform sampling on the input analog complementary signal $V_{in}$ during the first period $T_1$.

The gain stage 65 includes, in addition to the operational amplifier circuit 21, the feedback switch 23, the first capacitor 25, the second capacitor 27, the first switch 29, the second switch 31, the third capacitor 33, the third switch 35 and the fourth switch 37, a feedback switch 73, a fourth capacitor 75, a fifth capacitor 77, a fifth switch 79, a sixth switch 81, a sixth capacitor 83, a seventh switch 85, and an eighth switch 87.

The fourth capacitor 75 includes a first end 75a connected to the first complementary input 65d and a second end 75b connected to the non-inversion input 21b. The fifth capacitor 77 includes a first end 77a connected to the second complementary input 65e and a second end 77b connected to the non-inversion input 21b. The sixth switch 81 is connected between the first end 75a of the fourth capacitor 75 and the complementary output 21d of the operational amplifier circuit 21, and is provided to connect the fourth capacitor 75 between the non-inversion input 21b and the complementary output 21d during the second period $T_2$. The fifth switch 79 is connected between the first end 77a of the fifth capacitor 77 and the complementary output 21d of the operational amplifier circuit 21, and is provided to connect the fifth capacitor 77 between the complementary output 21d and the non-inversion input 21b of the operational amplifier circuit 21 during the third period $T_3$. The sixth capacitor 83 includes a first end 83a connected to the complementary output 21d of the operational amplifier circuit 21 and a second end 83b. The seventh switch 85 is connected between the second end 83b of the sixth capacitor 83 and the non-inversion input 21b, and is provided to connect the sixth capacitor 83 between the complementary output 21d and the non-inversion input 21b of the operational amplifier circuit 21 during the third period $T_3$. The eighth switch 87 is connected between a reference potential line serving as an earth wire and the second end 83b of the sixth capacitor 83, and is provided to provide a reference potential serving as a ground potential to the second end 83b of the sixth capacitor 83 during the first and second periods $T_1$, $T_2$. The feedback switch 73 is connected between the complementary output 21d and the non-inversion input 21b of the operational amplifier circuit 21.

A sub-A/D conversion circuit 90 includes two comparators 90a, 90b having a full differential constitution, for example. The comparator 90a generates a conversion result $D_0$. The comparator 90b generates a conversion result $D_1$. These conversion results are provided to the logic circuit 43 as digital signals and provided to a digital output of the conversion circuit 61.

The logic circuit 43 generates control signals $\phi_{DO1}$, $\phi_{DP1}$, $\phi_{DN1}$, $\phi_{DO2}$, $\phi_{DP2}$, $\phi_{DN2}$ corresponding to the digital signals ($D_0$, $D_1$).

In response to the control signals from the logic circuit 43, a D/A conversion circuit 89 provides $V_{D/A}$ (N)=$V_{D/A}$ (P)=Vref when the condition (1) (−Vref/4>$V_i$) is satisfied. When the condition (2) (Vref/4≧$V_i$≧−Vref/4) is satisfied, the first input 65a and first complementary input 65d are connected via a switch, and the second input 65b and second complementary input 65e are connected via a switch. When the condition (3) ($V_i$>+Vref/4) is satisfied, the D/A conversion circuit 89 provides $V_{D/A}$ (N)=$V_{D/A}$ (P)=−Vref. Here, $V_i$=$V_{ip}$−$V_{in}$.

As described above, according to the conversion circuit 61, the gain stage 65 having a full differential constitution is provided.

Second Embodiment

Figure 7:
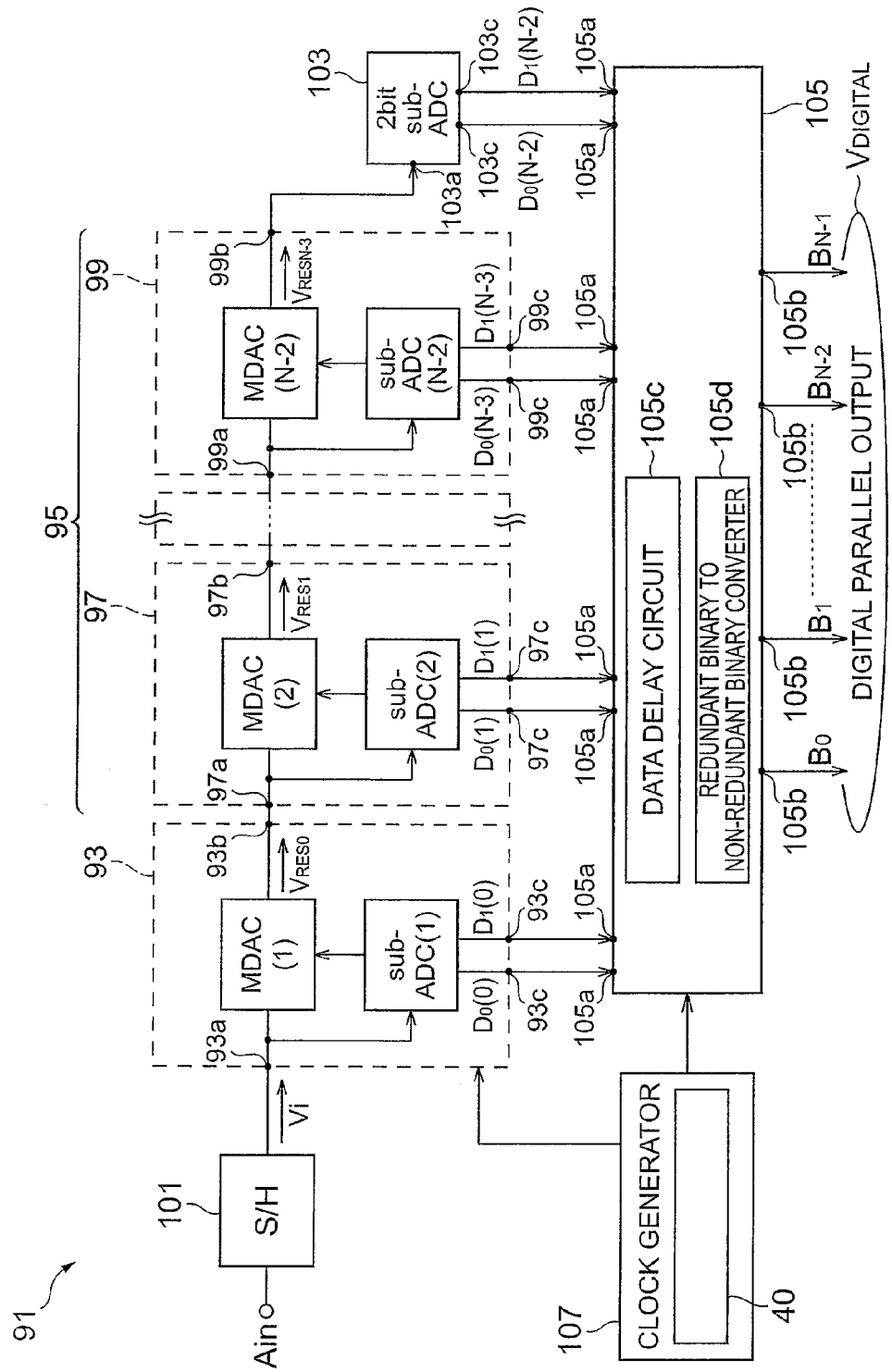
FIG. 7 is a schematic block diagram showing an analog/digital converter according to an embodiment.

FIG. 7 is a schematic block diagram showing an analog/digital converter according to this embodiment. An analog/digital converter 91 includes a first AD conversion stage 93 and one or a plurality of second AD conversion stages 95 (97, 99). The first and second AD conversion stages 93, 95 are connected in series. The first AD conversion stage 93 includes an input 93a for receiving the analog signal $V_i$, an analog output 93b for providing a residual analog signal $V_{RES0}$, and a digital output 93c for providing a digital signal ($D_0$ (0), $D_1$ (0)). The first AD conversion stage 93 includes one of the conversion circuits 15, 65 described above. The second AD conversion stage 97 includes an input 97a for receiving an analog signal from the previous stage, an analog output 97b for providing a residual analog signal $V_{RES1}$, and a digital output 97c for providing a digital signal ($D_0$ (1), $D_1$ (1)). The second AD conversion stage 99 includes an input 99a for receiving an analog signal from the previous stage, an analog output 99b for providing a residual analog signal $V_{RESN-3}$, and a digital output 99c for providing a digital signal ($D_0$ (N-3), $D_1$ (N-3)). Further, the second AD conversion stage 97 may use the conversion circuits 12, 15, 65. According to this analog/digital converter 91, capacitor mismatch can be compensated for in the first-stage conversion circuit. A multiplication type D/A converter (MDAC) shown in FIG. 7 includes the gain stage, logic circuit, and D/A conversion circuit shown in FIGS. 1, 5 and 6, for example.

Alternatively, in the analog/digital converter 91, all or a part of the second AD conversion stage array 95 may include the conversion circuits 15, 65. According to this analog/digital converter, capacitor mismatch compensation can be performed in the conversion circuits of the first stage and onward.

The analog/digital converter 91 may include a sample/hold (S/H) circuit 101, an additional analog/digital conversion circuit 103, and a logic circuit 105. The sample/hold circuit 101 is connected to the analog input 93a of the first AD conversion stage 93, and is used to hold an analog signal $A_{in}$ and provide a held analog signal $V_i$. The additional analog/digital conversion circuit 103 includes an input 103a connected to the analog output of the final conversion stage 99 from among the first and second AD conversion stages 93, 97, 99 connected in series, and a digital output 103c for providing a digital signal ($D_0$ (N-2), $D_1$ (N-2)). The logic circuit 105 includes an input 105a connected to the digital output 93c of the first AD conversion stage 93, the digital outputs 97c, 99c of the second AD conversion stages 97, 99, and the digital output 103c of the additional analog/digital conversion circuit 103. The logic circuit 105 includes an output 105b for providing a digital signal $V_{DIGITAL}$ corresponding to the analog signal $A_{in}$. The digital signal $V_{DIGITAL}$ has bits constituted by ($B_0$, $B_1$, ..., $B_{N-2}$, $B_{N-1}$). According to this analog/digital converter 91, a pipelined analog/digital converter is provided. Timing signals required in an operation of the analog/digital converter 91 are provided by a clock generator 107. When the AD conversion stages 93, 97, 99 provide the logic circuit 105 with a redundant 1.5-bit digital signal, for example, the logic circuit 105 may include a data delay circuit 105c serving as a shift register, and a redundant binary-non-redundant binary conversion circuit 105d, for example. If necessary, the digital outputs of the AD conversion stages 93, 97, 99 and the additional analog/digital conversion circuit 103 may provide a single-bit digital signal instead of a redundant binary digital signal.

Although this embodiment describes a 1.5-bit operation, this invention may be applied to a 1-bit calculation performed using a single comparator as well. Further, a full differential circuit may be used in this embodiment to cancel capacitor variation, in addition to a single end circuit. Furthermore, in a pipelined A/D converter, resistance to errors and noise increases steadily toward the later stages of the A/D conversion stage pipeline. Therefore, a conversion circuit employing three capacitors may be used in the stages close to the input of the pipelined A/D converter, and a conversion circuit employing two capacitors may be used in the remaining stages. In so doing, conversion circuits having a smaller number of capacitors can be used, enabling a reduction in the surface area of the A/D converter.

As described above, according to this embodiment, an analog/digital converter including a conversion circuit capable of compensating for capacitor mismatch through a minimum 1.5 clock operation is provided.

Third Embodiment

FIG. 8 is a block diagram showing the constitution of an analog/digital converter according to this embodiment. An analog/digital converter 111 includes a first AD conversion stage 113, a second AD conversion stage 115, and a feedback switch 117. The first and second AD conversion stages 113, 115 are connected in series. The first AD conversion stage 113 includes an input 113a for receiving the analog signal $V_i$, an analog output 113b for providing the residual analog signal $V_{RES0}$, and a digital output 113c for providing the digital signal ($D_0$ (0), $D_1$ (0)). The first AD conversion stage 93 includes one of the conversion circuits 15, 65 described above. The second AD conversion stage 115 includes an input 115a for receiving an analog signal from the previous stage, an analog output 115b for providing the residual analog signal $V_{RES1}$, and a digital output 115c for providing the digital signal ($D_0$ (1), $D_1$ (1)). The second AD conversion stage 115 may include the conversion circuits 15, 65. According to this analog/digital converter 111, capacitor mismatch can be compensated for in the conversion circuits of the first stage and onward. The feedback switch 117 is connected between the input 113a of the first AD conversion stage 113 and the analog output 115b of the second AD conversion stage 115. The feedback switch 117 provides a path from the output 115b of the second AD conversion stage 115 to the input 113a of the first AD conversion stage 113. A multiplication type D/A converter (MDAC) shown in FIG. 8 includes the gain stage, logic circuit, and D/A conversion circuit shown in FIGS. 1 and 6, for example.

According to this analog/digital converter 111, a cyclic analog/digital converter is provided using a plurality of conversion stages, for example two conversion stages. Further, according to the AD conversion stages 113, 115, a digital signal having one or a plurality of bits is provided at each stage.

The analog/digital converter 111 may further include a logic circuit 119. The logic circuit 119 includes an input 119a connected to the digital output 113c of the first AD conversion stage 113 and the digital output 115c of the second AD conversion stage 115. The logic circuit 119 includes an output 119b for providing the digital signal $V_{DIGITAL}$, which corresponds to the analog signal $A_{in}$ and has one or a plurality of bits. The logic circuit 119 may include data registers 119c for storing redundant digital signals from the respective AD conversion stages, and a conversion circuit 119d for generating a non-redundant digital signal from the group of redundant digital signals provided by the individual data registers 119c, for example.

According to the analog/digital converter 111, the digital signal $V_{DIGITAL}$ corresponding to the analog signal $A_{in}$ is provided at each stage of the first and second AD conversion stages 113, 115. The digital signal $V_{DIGITAL}$ includes one or a plurality of bits.

The analog/digital converter 111 includes a sample/hold (S/H) circuit 121. The S/H circuit 121 receives the analog signal $A_{in}$ in an input 121a, samples the received analog signal, and holds the sampled analog signal. The analog/digital converter 111 may further include a switch 121 connected between the input 113a of the first AD conversion stage 113 and an output 121b of the S/H circuit 121. The switch 121 is controlled by a clock signal $\phi_s$, and is closed in order to receive the analog signal $A_{in}$ during a sampling period, which is different to a feedback period, and opened during the feedback period, in which the feedback switch 117 is closed. Hence, it is possible to switch between the sampling period and the feedback period using the switch 121 and feedback switch 117 connected between the input 113a of the first AD conversion stage 113 and the output 119b of the sample/hold circuit 119. A clock generator 123 provides timing signals required in an operation of the analog/digital converter 111.

As described above, according to the analog/digital converter 111, an analog/digital converter including a conversion circuit capable of compensating for capacitor mismatch through a minimum 1.5 clock operation is provided.

The conversion circuits and A/D converters according to the first to third embodiments may be provided in a MOS transistor or the like, for example. Further, the switches may be realized as MOS analog switches.

Having been described and illustrated the principles of the present invention in preferred embodiments, it is appreciated by those having skill in the art that the invention can be modified in arrangement and detail without departing from such principles. In these embodiments, for example, a two-stage cyclic A/D converter is described, but the present invention is not limited to the specific constitution disclosed in the embodiments. The present invention may also be applied to a cyclic A/D converter having three or more stages. We therefore claim all modifications and variations coming within the spirit and scope of the following claims.

The invention claimed is:

1. A conversion circuit for an analog/digital converter, comprising:
   a gain stage having a first input, a second input, first to third capacitors, and an operational amplifier circuit, the first input being provided for receiving an input analog signal in a first period and receiving a converted analog signal in a second period, the converted analog signal being associated with the input analog signal, the second input being provided for receiving the input analog signal in the first period and receiving the converted analog signal in a third period, the second period being different from the first period, and the third period being different from the first period and the second period,
   wherein, in the first period, the first capacitor is connected between the first input of the gain stage and an inversion input of the operational amplifier circuit, the second capacitor is connected between the second input of the gain stage and the inversion input of the operational amplifier circuit, the first capacitor receives a charge corresponding to the analog signal via the first input, and the second capacitor receives a charge corresponding to the analog signal via the second input,
   wherein, in the second period, the second capacitor is connected between an output of the operational amplifier circuit and the inversion input of the operational amplifier circuit, the operational amplifier circuit generates a first operation value in the output thereof in response to the converted analog signal applied to the first capacitor via the first input, and the first operation value is stored in the third capacitor, and
   wherein, in the third period, the second capacitor is connected between the second input and the output of the operational amplifier circuit, the first and third capacitors are connected between the output and the inversion input of the operational amplifier circuit, and the operational amplifier circuit generates a second operation value in the output thereof in response to the converted analog signal applied to the second capacitor via the second input.

2. The conversion circuit according to claim 1, further comprising:
   an input for receiving the input analog signal;
   a first sampling switch, connected between the first input and the input, for sampling the input analog signal in the first period;
   a second sampling switch, connected between the second input and the input, for sampling the input analog signal in the first period;
   a sub-A/D conversion circuit, connected to the input, for generating a digital signal from the input analog signal, the digital signal having a predetermined number of bits in accordance with the input analog signal;
   a logic circuit, connected to the sub-A/D conversion circuit, for providing a control signal in accordance with the digital signal in the second period and the third period; and
   a D/A conversion circuit, connected to the logic circuit, for providing the converted analog signal in the second period and the third period, the converted analog signal being generated in accordance with the control signal.

3. The conversion circuit according to claim 2, wherein the sub-A/D conversion circuit includes a comparator for comparing the input analog signal with a predetermined reference signal and providing a comparison result signal.

4. The conversion circuit according to claim 2, wherein the sub-A/D conversion circuit generates a three-value redundant digital signal by comparing the input analog signal with two predetermined reference signals.

5. The conversion circuit according to claim 1,
   wherein the first capacitor includes a first end connected to the first input and a second end connected to the inversion input of the operational amplifier circuit, the second capacitor includes a first end connected to the second input and a second end connected to the inversion input of the operational amplifier circuit, the third capacitor includes a first end connected to the output of the operational amplifier circuit and a second end, and the gain stage further comprises:

a first switch, connected between the first end of the second capacitor and the output of the operational amplifier circuit, for connecting the second capacitor between the inversion input of the operational amplifier circuit and the output of the operational amplifier circuit in the second period;

a second switch, connected between the first end of the first capacitor and the output of the operational amplifier circuit, for connecting the first capacitor between the output and the inversion input of the operational amplifier circuit in the third period;

a third switch, connected between the second end of the third capacitor and the inversion input, for connecting the third capacitor between the output and the inversion input of the operational amplifier circuit in the third period; and a fourth switch, connected between the second end of the third capacitor and a reference potential line, for providing a reference potential to the second end of the third capacitor in the first period and the second period.

6. The conversion circuit according to claim 5, wherein the gain stage further comprises:

a first complementary input for receiving an input analog complementary signal in the first period and for receiving a converted analog complementary signal in the second period;

a second complementary input for receiving the input analog complementary signal in the first period and for receiving the converted analog complementary signal in the third period;

a fourth capacitor having a first end connected to the first complementary input and a second end connected to a non-inversion input of the operational amplifier circuit;

a fifth capacitor having a first end connected to the second complementary input and a second end connected to the non-inversion input of the operational amplifier circuit;

a fifth switch, connected between the first end of the fifth capacitor and a complementary output of the operational amplifier circuit, for connecting the fifth capacitor between the non-inversion input and the complementary output of the operational amplifier circuit in the second period;

a sixth switch, connected between the first end of the fourth capacitor and the complementary output of the operational amplifier circuit, for connecting the fourth capacitor between the complementary output and the non-inversion input of the operational amplifier circuit in the third period;

a sixth capacitor having a first end and a second end, the first end being connected to the complementary output of the operational amplifier circuit;

a seventh switch, connected between the second end of the sixth capacitor and the non-inversion input, for connecting the sixth capacitor between the complementary output and the non-inversion input of the operational amplifier circuit in the third period; and an eighth switch, connected between the second end of the sixth capacitor and the reference potential line, for providing the reference potential to the second end of the sixth capacitor in the first period and the second period.

7. An analog/digital converter, comprising:

a first AD conversion stage, the first AD conversion stage having an input for receiving an input analog signal and an analog output for providing a residual analog signal, the first AD conversion stage including a digital output for providing a digital signal of a predetermined number of bits, and the first AD conversion stage including the conversion circuit according to claim 1; and one or more second AD conversion stages, each of the second AD conversion stages having an input for receiving a residual analog signal from a previous-stage AD conversion stage and an analog output for providing the residual analog signal received from the AD conversion stage, each of the second AD conversion stages including a digital output for providing the digital signal of the predetermined number of bits, and the first and second AD conversion stages being connected in series.

8. The analog/digital converter according to claim 7, wherein the second AD conversion stage includes a conversion circuit, and the conversion circuit comprises:

a gain stage having a first input, a second input, first to third capacitors, and an operational amplifier circuit, the first input being provided for receiving an input analog signal in a first period and receiving a converted analog signal in a second period, the converted analog signal being associated with to the input analog signal, the second input being provided for receiving the input analog signal in the first period and receiving the converted analog signal in a third period, the second period being different from the first period, and the third period being different from the first period and the second period, wherein, in the first period, the first capacitor is connected between the first input of the gain stage and an inversion input of the operational amplifier circuit, the second capacitor is connected between the second input of the gain stage and the inversion input of the operational amplifier circuit, the first capacitor receives a charge corresponding to the analog signal via the first input, and the second capacitor receives a charge corresponding to the analog signal via the second input, wherein, in the second period, the second capacitor is connected between an output of the operational amplifier circuit and the inversion input of the operational amplifier circuit, the operational amplifier circuit generates a first operation value in the output thereof in response to the converted analog signal applied to the first capacitor via the first input, and the first operation value is stored in the third capacitor, and wherein, in the third period, the second capacitor is connected between the second input and the output of the operational amplifier circuit, the first and third capacitors are connected between the output and the inversion input of the operational amplifier circuit, and the operational amplifier circuit generates a second operation value in the output thereof in response to the converted analog signal applied to the second capacitor via the second input.

9. The analog/digital converter according to claim 7, further comprising:

a sample/hold circuit, connected to the input of the first AD conversion stage, for holding an analog signal;

an additional analog/digital conversion circuit connected to an analog output of a final conversion stage of the series-connected first and second AD conversion stages, the additional analog/digital conversion circuit having a digital output for providing a digital signal; and a digital logic circuit connected to the digital output of the first AD conversion stage, the digital outputs of the second AD conversion stages, and the digital output of the additional analog/digital conversion circuit, wherein the digital logic circuit provides a digital signal, and the digital signal is an AD-converted version of the input analog signal.

10. The analog/digital converter according to claim 8, further comprising:

a sample/hold circuit, connected to the input of the first AD conversion stage, for holding an analog signal;

an additional analog/digital conversion circuit connected to an analog output of a final conversion stage of the series-connected first and second AD conversion stages, the additional analog/digital conversion circuit having a digital output for providing a digital signal, and a digital logic circuit connected to the digital output of the first AD conversion stage, the digital outputs of the second AD conversion stages, and the digital output of the additional analog/digital conversion circuit, wherein the digital logic circuit provides a digital signal, and the digital signal is an AD-converted version of the input analog signal.

11. The analog/digital converter according to claim 8, wherein a number of the second AD conversion stages is one, and the analog/digital converter further comprises a feedback switch connected between the input of the first AD conversion stage and the analog output of the second AD conversion stage.

12. The analog/digital converter according to claim 11, further comprising:

a digital logic circuit connected to the digital output of the first AD conversion stage and the digital output of the second AD conversion stage, wherein the digital logic circuit provides a digital signal constituted by a plurality of bits, and the plurality of bits corresponds to an AD-converted version of the input analog signal.

13. The analog/digital converter according to claim 11 further comrising:

a sample/hold circuit for holding an analog signal; and a switch, connected between the input of the first AD conversion stage and an output of the sample/hold circuit, for providing the input analog signal in a sampling period, the feedback switch providing a path from the output of the second AD conversion stage to the input of the first AD conversion stage in a feedback period, and the feedback period is different to the sampling period.

14. The analog/digital converter according to claim 12, further comprising;

a sample/hold circuit for holding an analog signal; and a switch, connected between the input of the first AD conversion stage and an output of the sample/hold circuit, for providing the input analog signal in a sampling period, the feedback switch providing a path from the output of the second AD conversion stage to the input of the first AD conversion stage in a feedback period, and the feedback period is different to the sampling period.

15. A method of generating a digital signal from an input analog signal by use of a gain stage, the gain stage including first to third capacitors and an operational amplifier circuit, first ends of the first and second capacitors being connected to an inversion input of the operational amplifier circuit, and a first end of the third capacitor being connected to an output of the operational amplifier circuit, the method comprising:

a first step of storing a charge in each of the first capacitor and second capacitor and generating a digital signal of a predetermined number of bits, quantity of the charge corresponding to the input analog signal, and the digital signal corresponding to a digital version of the input analog signal;

a second step of connecting the second capacitor between the output of the operational amplifier circuit and the inversion input of the operational amplifier circuit and supplying the first end of the first capacitor with a analog signal of a D/A-converted version of the digital signal to provide the output of the operational amplifier circuit with a first operation value generated from the input analog signal, rearrange the charges of the first and second capacitors, and store a charge in the third capacitor, the stored charge corresponding to the first operation value; and a third step of connecting the first and third capacitors between the output and the inversion input of the operational amplifier circuit and supplying the first end of the second capacitor with the analog signal of the D/A-converted version of the digital signal to provide the output of the operational amplifier circuit with a second operation value generated from the input analog signal, and rearrange the charge of each of the first, second and third capacitors.

16. The method according to claim 15, further comprising the steps of:

providing a subsequent gain stage with the second operation value in the gain stage as the analog signal; and performing the first to third steps in the subsequent gain stage.

17. The method according to claim 16, further comprising the steps of:

performing the first to third steps in a previous gain stage; and providing the gain stage with the second operation value of the previous gain stage as the analog signal.

18. The method according to claim 17, further comprising the steps of:

performing the first to third steps in a previous gain stage; and providing the gain stage with the second operation value of the previous gain stage as the analog signal.

* * * * *